United States Patent
Mori et al.

(10) Patent No.: US 12,020,936 B2
(45) Date of Patent: Jun. 25, 2024

(54) SUBSTRATE PROCESSING APPARATUS AND SUBSTRATE PROCESSING METHOD

(71) Applicant: Tokyo Electron Limited, Tokyo (JP)

(72) Inventors: Hirotoshi Mori, Kumamoto (JP); Takeshi Tamura, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 243 days.

(21) Appl. No.: 17/413,605

(22) PCT Filed: Dec. 9, 2019

(86) PCT No.: PCT/JP2019/048090
§ 371 (c)(1),
(2) Date: Jun. 14, 2021

(87) PCT Pub. No.: WO2020/129732
PCT Pub. Date: Jun. 25, 2020

(65) Prior Publication Data
US 2022/0044935 A1    Feb. 10, 2022

(30) Foreign Application Priority Data
Dec. 21, 2018 (JP) ................................. 2018-240177

(51) Int. Cl.
*H01L 21/268* (2006.01)
*B23K 26/57* (2014.01)

(52) U.S. Cl.
CPC ............ *H01L 21/268* (2013.01); *B23K 26/57* (2015.10)

(58) Field of Classification Search
CPC ..... H01L 21/268; H01L 21/185; B23K 26/57; B23K 26/53
See application file for complete search history.

(56) References Cited

U.S. PATENT DOCUMENTS

2007/0010067 A1* 1/2007 Shimoda ............. H01L 27/1266
                                                   438/455
2010/0009549 A1* 1/2010 Sekiya ................. H01L 21/268
                                                   438/795
(Continued)

FOREIGN PATENT DOCUMENTS

JP    H9-216152 A    8/1997
JP    2004-111606 A  4/2004
(Continued)

OTHER PUBLICATIONS

International Search Report of PCT/JP2019/048090 dated Feb. 4, 2020.
(Continued)

*Primary Examiner* — Brian Turner
(74) *Attorney, Agent, or Firm* — Shih IP Law Group, PLLC.

(57) ABSTRACT

A substrate processing apparatus configured to process a substrate includes a holder configured to hold, in a combined substrate in which a first substrate and a second substrate are bonded to each other, the second substrate; and a modifying device configured to form, to an inside of the first substrate held by the holder, a peripheral modification layer by radiating laser light for periphery along a boundary between a peripheral portion of the first substrate as a removing target and a central portion thereof, and, also, configured to form an internal modification layer by radiating laser light for internal surface along a plane direction of the first substrate. The modifying device switches the laser light for periphery and the laser light for internal surface by adjusting at least a shape or a number of the laser light for periphery and the laser light for internal surface.

20 Claims, 20 Drawing Sheets

(56) References Cited

U.S. PATENT DOCUMENTS

| | | | | |
|---|---|---|---|---|
| 2012/0223061 | A1* | 9/2012 | Atsumi | B23K 26/53 |
| | | | | 219/121.72 |
| 2013/0312460 | A1* | 11/2013 | Kunishi | B23K 26/0665 |
| | | | | 65/112 |
| 2014/0305917 | A1* | 10/2014 | Gadd | B23K 26/36 |
| | | | | 219/121.72 |
| 2015/0140785 | A1 | 5/2015 | Kwak | |
| 2016/0052090 | A1* | 2/2016 | Tanigawa | B23K 26/364 |
| | | | | 219/121.68 |
| 2016/0064229 | A1* | 3/2016 | Kim | B28D 5/0011 |
| | | | | 225/2 |
| 2017/0320165 | A1* | 11/2017 | Hyakumura | B23K 26/046 |
| 2018/0229331 | A1* | 8/2018 | Hirata | H01L 21/0201 |
| 2019/0061050 | A1* | 2/2019 | Sai | B23K 26/032 |

FOREIGN PATENT DOCUMENTS

| | | |
|---|---|---|
| JP | 2006-108532 A | 4/2006 |
| JP | 2009-131942 A | 6/2009 |
| JP | 2009-135342 A | 6/2009 |
| JP | 2011-159798 A | 8/2011 |
| JP | 2012-064667 A | 3/2012 |
| JP | 2012-069736 A | 4/2012 |
| JP | 2012-109341 A | 6/2012 |
| JP | 2014-167966 A | 9/2014 |
| JP | 2015-516672 A | 6/2015 |
| JP | 2016-043401 A | 4/2016 |
| JP | 2016-215231 A | 12/2016 |
| JP | 2017-024039 A | 2/2017 |
| JP | 2017-071074 A | 4/2017 |
| JP | 2017-191825 A | 10/2017 |
| JP | 2018-043340 A | 3/2018 |
| WO | 2013126927 A2 | 8/2013 |

OTHER PUBLICATIONS

International Search Report of PCT/JP2019/028310 dated Oct. 8, 2019.

* cited by examiner

FIG. 13A  FIG. 13B  FIG. 13C
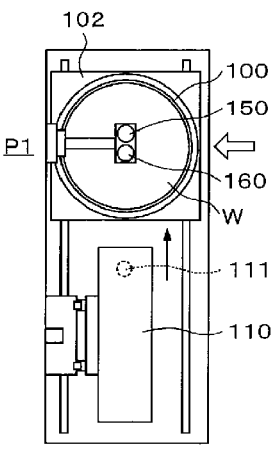
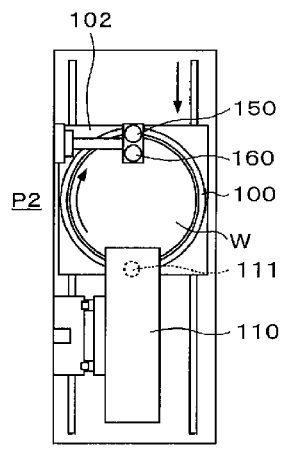
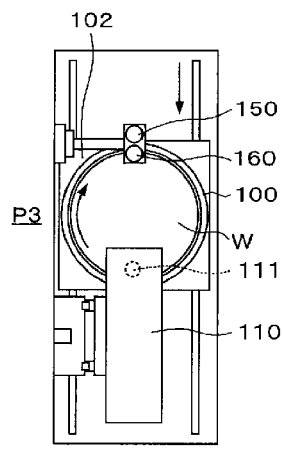
FIG. 13D  FIG. 13E
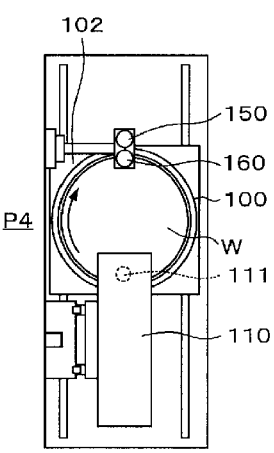
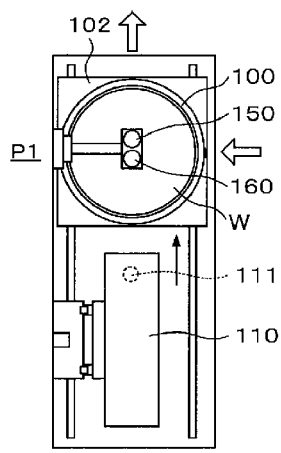
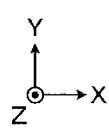

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2019/048090 filed on Dec. 9, 2019, which claims the benefit of Japanese Patent Application No. 2018-240177 filed on Dec. 21, 2018, the entire disclosures of which are incorporated herein by reference.

TECHNICAL FIELD

The various aspects and embodiments described herein pertain generally to a substrate processing apparatus and a substrate processing method.

BACKGROUND

Patent Document 1 discloses a manufacturing method for a stacked semiconductor device. In this manufacturing method, the stacked semiconductor device is produced by stacking two or more semiconductor wafers. At this time, after each semiconductor wafer is stacked on another semiconductor wafer, a rear surface of the semiconductor wafer is ground so that it has a required thickness.

It is described in Patent Document 2 that a circular plate-shaped grinding tool having abrasive grains at a peripheral portion thereof is rotated and at least an outer peripheral surface of the grinding tool is brought into linear contact with a semiconductor wafer to grind a circumferential end of the semiconductor wafer into a substantially L-shape. The semiconductor wafer is produced by bonding two sheets of silicon wafers.

PRIOR ART DOCUMENT

Patent Document 1: Japanese Patent Laid-open Publication No. 2012-069736
Patent Document 2: Japanese Patent Laid-open Publication No. H09-216152

DISCLOSURE OF THE INVENTION

Means for Solving the Problems

In an exemplary embodiment, a substrate processing apparatus configured to process a substrate includes a holder configured to hold, in a combined substrate in which a first substrate and a second substrate are bonded to each other, the second substrate; and a modifying device configured to form, to an inside of the first substrate held by the holder, a peripheral modification layer by radiating laser light for periphery along a boundary between a peripheral portion of the first substrate as a removing target and a central portion thereof, and, also, configured to form an internal modification layer by radiating laser light for internal surface along a plane direction of the first substrate. The modifying device switches the laser light for periphery and the laser light for internal surface by adjusting at least a shape or a number of the laser light for periphery and the laser light for internal surface.

BRIEF DESCRIPTION OF THE DRAWINGS

FIG. 13A to FIG. 13E are explanatory diagrams illustrating main processes of a modifying processing.

DETAILED DESCRIPTION

Figure 1:
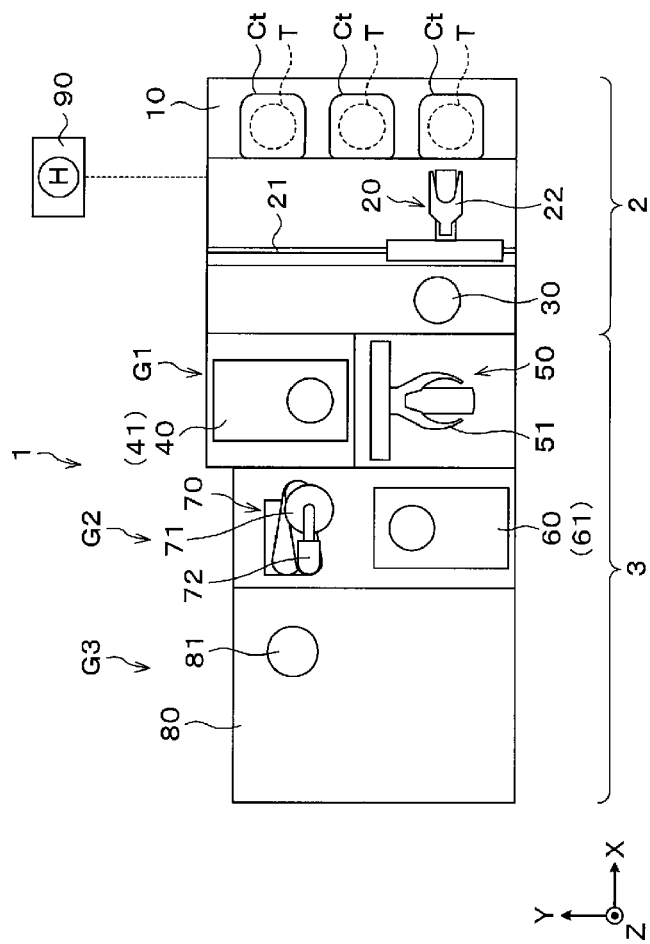
FIG. 1 is a plan view illustrating a configuration of a wafer processing system according to an exemplary embodiment.

In a manufacturing process for a semiconductor device, a semiconductor wafer having, for example, a plurality of devices such as electronic circuits on a front surface thereof is thinned by grinding a rear surface of the wafer, as described in Patent Document 1, for example.

The grinding of the rear surface of the wafer is performed by rotating the wafer and a grinding whetstone and lowering the grinding whetstone in a state that the grinding whetstone is in contact with the rear surface of the wafer, for example. In this case, since the grinding whetstone is worn away, it needs to be replaced regularly. Further, since grinding water is used in the grinding processing, disposal of a waste liquid is also required. As a result, a running cost is increased in the conventional wafer thinning processing.

Typically, a peripheral portion of the wafer is chamfered. If, however, the grinding processing is performed on the rear surface of the wafer as stated above, the peripheral portion of the wafer is given a sharp pointed shape (a so-called knife edge shape). If so, chipping takes place at the peripheral portion of the wafer, and the wafer may be damaged. Thus, there is performed a so-called edge trimming of removing the peripheral portion of the wafer prior to the grinding processing.

The end surface grinding apparatus described in the aforementioned Patent Document 2 is an apparatus configured to perform this edge trimming. In this end surface grinding apparatus, however, since the edge trimming is performed by the grinding, a whetstone is worn away and needs to be replaced regularly. Further, since a large amount of the grinding water is used, the disposal of the waste liquid is required. For these reasons, the running cost is increased in the conventional edge trimming.

To carry out the thinning and the edge trimming efficiently, the present disclosure provides a technique capable of performing pre-treatments therefor efficiently. Hereinafter, a wafer processing system as a substrate processing apparatus and a wafer processing method as a substrate processing method according to an exemplary embodiment will be described with reference to the accompanying drawings. Further, in the present specification and the drawings, parts having substantially same functional configurations will be assigned same reference numerals, and redundant description thereof will be omitted.

First, a configuration of the wafer processing system according to the present exemplary embodiment will be described. FIG. 1 is a plan view illustrating a schematic configuration of a wafer processing system 1.

Figure 2:
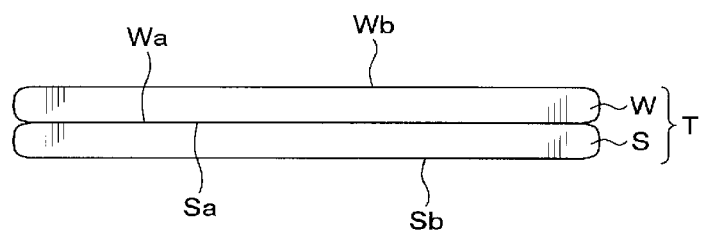
FIG. 2 is a side view illustrating a schematic structure of a combined wafer.
Figure 3:
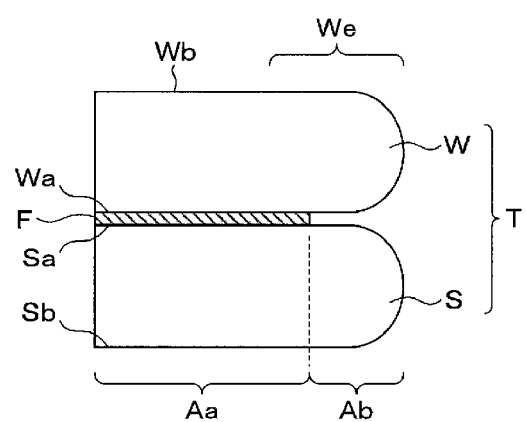
FIG. 3 is a side view illustrating a schematic structure of a part of the combined wafer.

The wafer processing system 1 performs a required processing on a combined wafer T as a combined substrate in which a processing target wafer W as a first substrate and a support wafer S as a second substrate are bonded to each other, as illustrated in FIG. 2 and FIG. 3. In the wafer processing system 1, a peripheral portion We of the processing target wafer W is removed, and the processing target wafer W is thinned. Hereinafter, in the processing target wafer W, a surface bonded to the support wafer S will be referred to as "front surface Wa," and a surface opposite to the front surface Wa will be referred to as "rear surface Wb." Likewise, in the support wafer S, a surface bonded to the processing target wafer W will be referred to as "front surface Sa," and a surface opposite to the front surface Sa will be referred to as "rear surface Sb".

The processing target wafer W is a semiconductor wafer such as, but not limited to, a silicon wafer, and has, on the front surface Wa thereof, a device layer (not shown) including a plurality of devices. Further, an oxide film F, for example, a $SiO_2$ film (TEOS film) is further formed on the device layer. The peripheral portion We of the processing target wafer W is chamfered, and a thickness of the peripheral portion We decreases toward a leading end thereof on a cross section thereof. Here, the peripheral portion We is a portion to be removed by edge trimming and ranges from, e.g., 1 mm to 5 mm from an edge of the processing target wafer W in a diametrical direction thereof.

In FIG. 2, for the sake of simplicity of illustration, illustration of the oxide film F is omitted. In the other drawings recited in the following description, illustration of the oxide film F may sometimes be omitted as well.

The support wafer S is a wafer configured to support the processing target wafer W, and is, for example, a silicon wafer. An oxide film (not shown) is formed on the surface Sa of the support wafer S. Further, the support wafer S serves as a protection member which protects the devices on the front surface Wa of the processing target wafer W. Further, if the support wafer S has a plurality of devices on the front surface Sa thereof, a device layer (not shown) is formed on the front surface Sa, the same as in the processing target wafer W.

Here, if the processing target wafer W and the support wafer S are bonded at the peripheral portion We of the processing target wafer W, the peripheral portion We may not be removed appropriately. For the reason, at an interface between the processing target wafer W and the support wafer S, a bonding region Aa where the oxide film F and the front surface Sa of the support wafer S are bonded and a non-bonding region Ab are formed. The non-bonding region Ab is located at an outside of the bonding region Aa in the diametrical direction. Since this non-bonding region Ab is provided, the peripheral portion We can be appropriately removed. Further, it is desirable that an outer end portion of the bonding region Aa is located slightly outer than an inner end portion of the peripheral portion We to be removed in the diametrical direction, as will be described in detail.

As depicted in FIG. 1, the wafer processing system 1 includes a carry-in/out station 2 and a processing station 3 connected as one body. In the carry-in/out station 2, a cassette Ct capable of accommodating therein a multiple number of combined wafers T is carried to/from the outside, for example. The processing station 3 is equipped with various kinds of processing apparatuses configured to perform required processings on the combined wafers T.

A cassette placing table 10 is provided in the carry-in/out station 2. In the shown example, a plurality of, for example, three cassettes Ct can be arranged on the cassette placing table 10 in a row in the Y-axis direction. Further, the number of the cassettes Ct placed on the cassette placing table 10 is not limited to the example of the present exemplary embodiment but can be selected as required.

In the carry-in/out station 2, a wafer transfer device 20 is provided adjacent to the cassette placing table 10 at a negative X-axis side of the cassette placing table 10. The wafer transfer device 20 is configured to be movable on a transfer path 21 which is elongated in the Y-axis direction. Further, the wafer transfer device 20 is equipped with, for example, two transfer arms 22 each of which is configured to hold and transfer the combined wafer T. Each transfer arm 22 is configured to be movable in a horizontal direction and a vertical direction and pivotable around a horizontal axis and a vertical axis. Further, the configuration of the transfer arm 22 is not limited to the exemplary embodiment, and various other configurations may be adopted. The wafer transfer device 20 is configured to be capable of transferring the combined wafer T to/from the cassette Ct of the cassette placing table 10 and a transition device 30 to be described later.

In the carry-in/out station 2, the transition device 30 configured to deliver the combined wafer T is provided adjacent to the wafer transfer device 20 at a negative X-axis side of the wafer transfer device 20.

The processing station 3 is provided with, for example, three processing blocks G1 to G3. The first processing block G1, the second processing block G2 and the third processing block G3 are arranged side by side in this sequence from a positive X-axis side (from a carry-in/out station 2 side) toward a negative X-axis side.

The first processing block G1 is equipped with an etching apparatus 40, a cleaning apparatus 41 and a wafer transfer device 50. The etching apparatus 40 and the cleaning apparatus 41 are stacked on top of each other. Further, the number and the layout of the etching apparatus 40 and the cleaning apparatus 41 are not limited to the shown example. By way of example, the etching apparatus 40 and the cleaning apparatus 41 may be elongated in the X-axis direction and arranged side by side when viewed from the top. Further, a plurality of etching apparatuses 40 and a plurality of cleaning apparatuses 41 may be respectively stacked on top of each other.

The etching apparatus 40 is configured to etch the rear surface Wb of the processing target wafer W grounded by a processing apparatus 80 to be described later. By way of example, by supplying a chemical liquid (etching liquid) onto the rear surface Wb, the rear surface Wb is wet-etched. For instance, HF, $HNO_3$, $H_3PO_4$, TMAH, Choline, KOH, or the like may be used.

The cleaning apparatus 41 is configured to clean the rear surface Wb of the processing target wafer W grounded by the processing apparatus 80 to be described later. By way of example, by bringing a brush into contact with the rear surface Wb, the rear surface Wb is cleaned by being scrubbed. Furthermore, a pressurized cleaning liquid may be used for the cleaning of the rear surface Wb. In addition, the cleaning apparatus 41 may be configured to clean the rear surface Sb of the support wafer S as well as the rear surface Wb of the processing target wafer W.

The wafer transfer device 50 is disposed at, for example, a negative Y-axis side of the etching apparatus 40 and the cleaning apparatus 41. The wafer transfer device 50 has, for example, two transfer arms 51 each of which is configured to hold and transfer the combined wafer T. Each transfer arm 51 is configured to be movable in a horizontal direction and a vertical direction and pivotable around a horizontal axis and a vertical axis. Further, the configuration of the transfer arm 51 is not limited to the exemplary embodiment, and various other configurations may be adopted. Additionally, the wafer transfer device 50 is configured to be capable of transferring the combined wafer T to/from the transition device 30, the etching apparatus 40, the cleaning apparatus 41 and a modifying apparatus 60 to be described later.

The second processing block G2 is equipped with the modifying apparatus 60, a periphery removing apparatus 61 and a wafer transfer device 70. The modifying apparatus 60 and the periphery removing apparatus 61 are stacked on top of each other. Further, the number and the layout of the modifying apparatus 60 and the periphery removing apparatus 61 is not limited to the example of the present exemplary embodiment.

The modifying apparatus 60 is configured to form a peripheral modification layer, a split modification layer and an internal modification layer by radiating laser light to an inside of the processing target wafer W. A specific configuration of the modifying apparatus 60 will be elaborated later.

The periphery removing apparatus 61 is configured to remove the peripheral portion We of the processing target wafer W, starting from the peripheral modification layer formed by the modifying apparatus 60. A specific configuration of the periphery removing apparatus 61 will be elaborated later.

The wafer transfer device 70 is disposed at, for example, a positive Y-axis side of the modifying apparatus 60 and the periphery removing apparatus 61. The wafer transfer device 70 is equipped with, for example, two transfer arms 71 each of which is configured to hold and transfer the combined wafer T. Each transfer arm 71 is supported at a multi-joint arm member 72 and configured to be movable in a horizontal direction and a vertical direction and pivotable around a horizontal axis and a vertical axis. A specific configuration of the transfer arm 71 will be elaborated later. The wafer transfer device 70 is configured to be capable of transferring the combined wafer T to/from the cleaning apparatus 41, the modifying apparatus 60, the periphery removing apparatus 61 and the processing apparatus 80 to be described later.

The third processing block G3 is equipped with the processing apparatus 80. The number and the layout of the processing apparatus 80 is not limited to the example of the present exemplary embodiment, and a plurality of processing apparatuses 80 may be arranged as required.

The processing apparatus 80 is configured to grind the rear surface Wb of the processing target wafer W. Further, the processing apparatus 80 is configured to remove, in the rear surface Wb having the internal modification layer formed therein, the corresponding internal modification layer, and also removes the peripheral modification layer. To be specific, the processing apparatus 80 grinds the rear surface Wb by rotating the processing target wafer W and a grinding whetstone (not shown) in the state that the rear surface Wb of the processing target wafer W held by the chuck 81 is in contact with the grinding whetstone. Further, a commonly known grinding apparatus (polishing apparatus) is used as the processing apparatus 80. For example, an apparatus described in Japanese Patent Laid-open Publication No. 2010-069601 may be used.

The above-described wafer processing system 1 is equipped with a control device 90. The control device 90 is implemented by, for example, a computer, and includes a program storage (not shown). A program for controlling a processing of the combined wafer T in the wafer processing system 1 is stored in the program storage. Further, the program storage also stores therein a program for implementing a substrate processing to be described later in the wafer processing system 1 by controlling the above-described various processing apparatuses and a driving system such as the transfer devices. Further, the programs may be recorded in a computer-readable recording medium H, and may be installed from this recording medium H to the control device 90.

Figure 4:
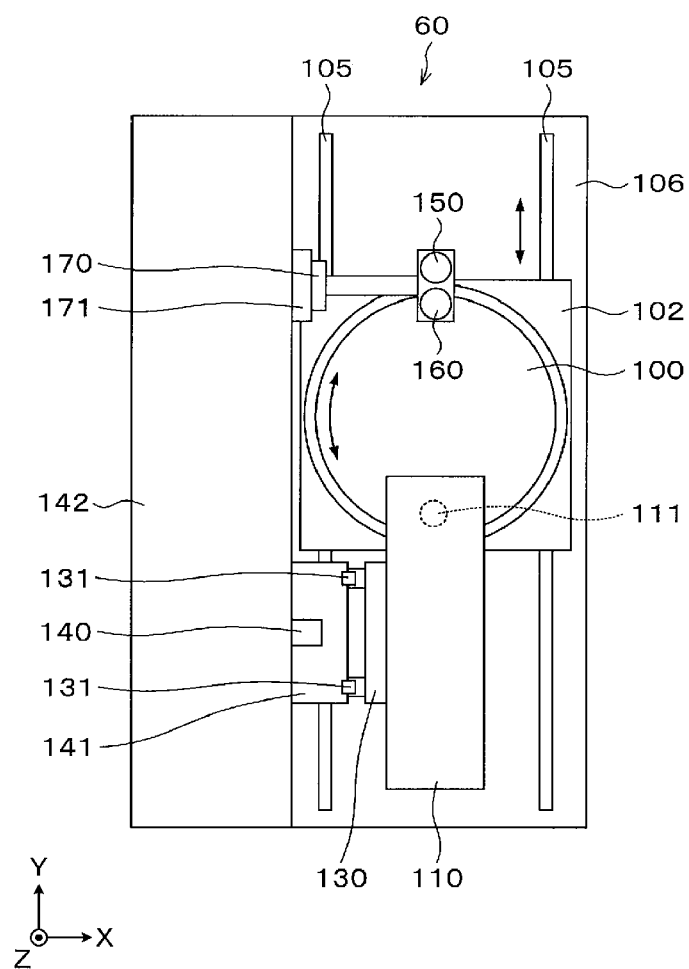
FIG. 4 is a plan view illustrating a schematic configuration of a modifying apparatus.
Figure 5:
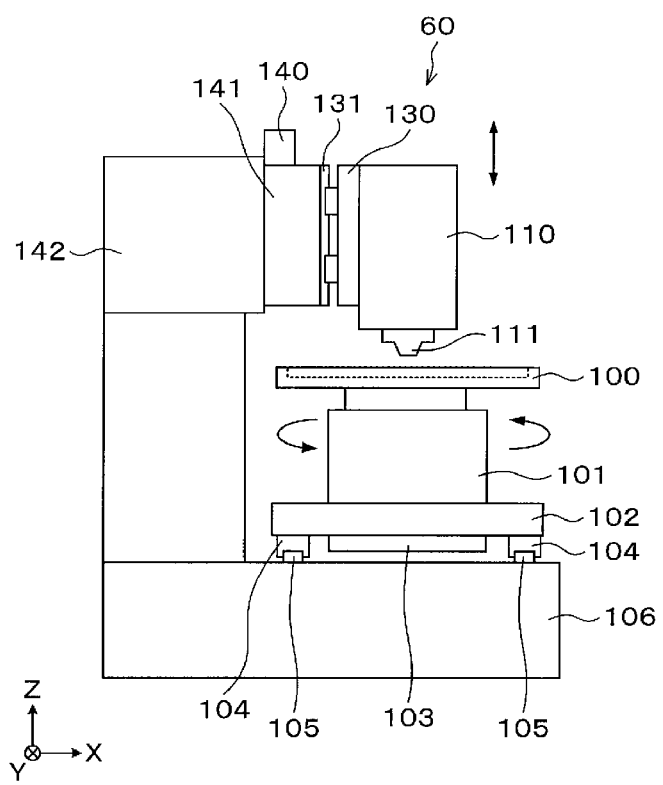
FIG. 5 is a side view illustrating the schematic configuration of the modifying apparatus.

Now, the aforementioned modifying apparatus 60 will be described. FIG. 4 is a plan view illustrating a schematic configuration of the modifying apparatus 60. FIG. 5 is a side view illustrating the schematic configuration of the modifying apparatus 60.

The modifying apparatus 60 is equipped with a chuck 100 as a holder configured to hold the combined wafer T on a top surface thereof. The chuck 100 is configured to attract and hold the support wafer S in the state that the processing target wafer W is placed at an upper side and the support wafer S is placed at a lower side. The chuck 100 is supported on a slider table 102 with an air bearing 101 therebetween. A rotator 103 is provided at a bottom surface side of the slider table 102. The rotator 103 incorporates therein, for example, a motor as a driving source. The chuck 100 is configured to be rotated around a vertical axis by the rotator 103 via the air bearing 101 therebetween. The slider table 102 is configured to be moved by a horizontally moving member 104, which is provided at a bottom surface side thereof, along a rail 105 which is provided on a base 106 and elongated in the Y-axis direction. Further, though not particularly limited, a driving source of the horizontally moving member 104 may be, for example, a linear motor.

A laser head 110 as a modifying device is provided above the chuck 100. The laser head 110 has a lens 111. The lens 111 is a cylindrical member provided on a bottom surface of the laser head 110, and is configured to radiate the laser light to the processing target wafer W held by the chuck 100.

Figure 6:
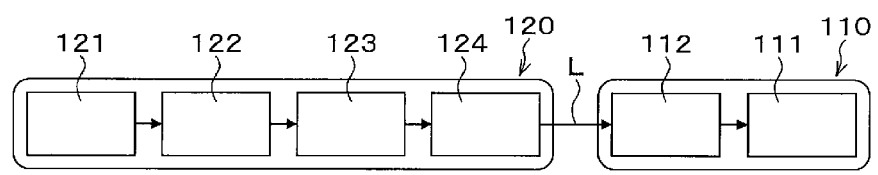
FIG. 6 is an explanatory diagram illustrating a schematic configuration of a laser head and a laser light output unit.
Figure 7:
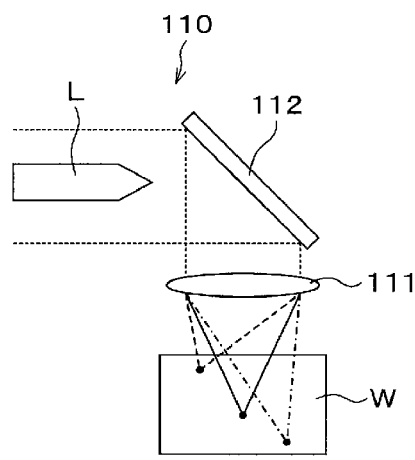
FIG. 7 is an explanatory diagram illustrating a flow of laser light in the laser head.

As shown in FIG. 6, the laser head 110 is further equipped with a non-illustrated LCOS (Liquid Crystal on Silicon) 112. The LCOS 112 serves as a spatial light modulator, and is configured to modulate and output the laser light. To be specific, the LCOS 112 includes liquid crystal mirrors (not shown) arranged longitudinally and transversally to obtain a required resolution. As depicted in FIG. 7, laser light L inputted to the laser head 110 is transmitted to the lens 111 by being reflected on the LCOS 112 and radiated to the processing target wafer W. At this time, the LCOS 112 is capable of controlling a focal position and a phase of the laser light L, and is thus capable of adjusting a shape and a number (a split number) of the laser light L radiated to the processing target wafer W. Further, the focal position of the laser light L may be adjusted by moving the laser head 110 up and down as well.

Further, as illustrated in FIG. 6, the laser head 110 is connected with a laser light output unit 120 configured to output the laser light L to the laser head 110. The laser light output unit 120 includes a laser light oscillator 121, an attenuator 122, a beam expander 123 and an optical axis adjusting mirror 124, and is configured to output the high-frequency laser light L in a pulse shape. In the laser light output unit 120, the laser light L oscillated from the laser light oscillator 121 is attenuated by the attenuator 122, and outputted to the laser head 110 after an optical axis of this laser light L is adjusted by the beam expander 123 and the optical axis adjusting mirror 124.

The laser head 110 concentrates and radiates the laser light L having a wavelength featuring transmissivity for the processing target wafer W to a required position within the processing target wafer W as the high-frequency laser light L in the pulse shape outputted from the laser light output unit 120. Accordingly, a portion within the processing target wafer W to which the laser light L is concentrated is modified, so that a peripheral modification layer, a split modification layer and an internal modification layer are formed.

As shown in FIG. 4 and FIG. 5, the laser head 110 is supported at a supporting member 130. The laser head 110 is configured to be moved up and down by an elevating mechanism 140 along a vertically elongated rail 131. Further, the laser head 110 is configured to be moved in the Y-axis direction by a moving mechanism 141. Each of the elevating mechanism 140 and the moving mechanism 141 is supported at a supporting column 142.

Above the chuck 100, a macro-camera 150 and a micro-camera 160 are provided at a positive Y-axis side of the laser head 110. For example, the macro-camera 150 and the micro-camera 160 are formed as one body, and the macro-camera 150 is provided at a positive Y-axis side of the micro-camera 160. The macro-camera 150 and the micro-camera 160 are configured to be moved up and down by an elevating mechanism 170, and also configured to be moved in the Y-axis direction by a moving mechanism 171.

The macro-camera 150 images an outer end portion of the processing target wafer W (combined wafer T). The macro-camera 150 is equipped with, for example, a coaxial lens, and radiates visible light, for example, red light and receives reflection light from a target object. For example, the macro-camera 150 has an image magnification of two times.

The micro-camera 160 images a peripheral portion of the processing target wafer W and also images a boundary between the bonding region Aa and the non-bonding region Ab. The micro-camera 160 is equipped with, for example, a coaxial lens, and radiates infrared light (IR light) and receives reflection light from a target object. By way of example, the micro-camera 160 has an image magnification of 10 times. A field of view of the micro-camera 160 is about ⅕ of a field of view of the macro-camera 150, and a pixel size of the micro-camera 160 is about ⅕ of a pixel size of the macro-camera 150.

Figure 8:
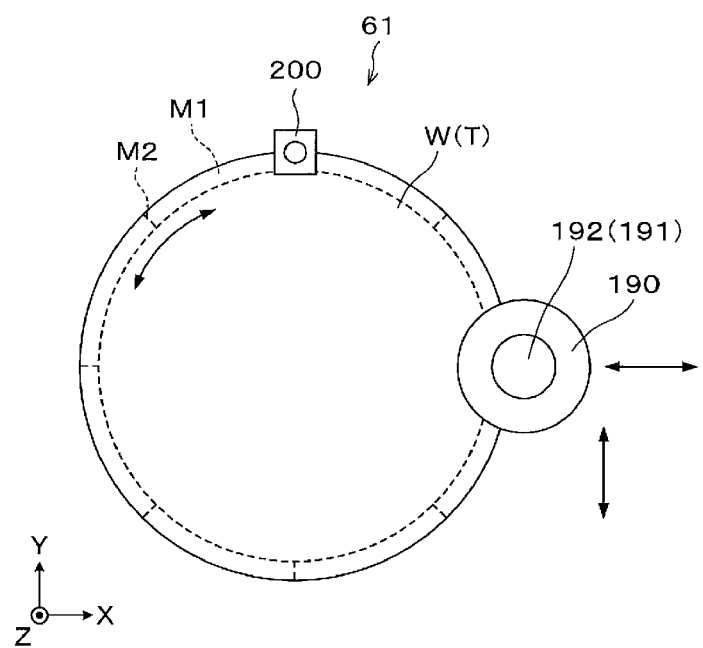
FIG. 8 is a plan view illustrating a schematic configuration of a periphery removing apparatus.
Figure 9:
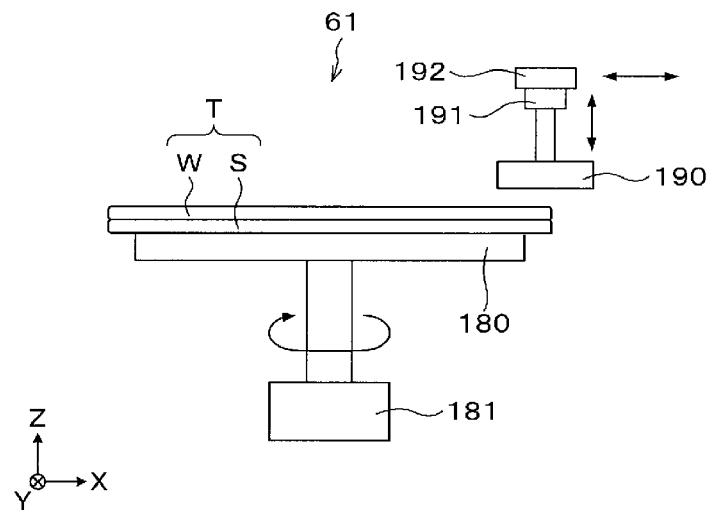
FIG. 9 is a side view illustrating a schematic configuration of the periphery removing apparatus.

Now, the aforementioned periphery removing apparatus 61 will be explained. FIG. 8 is a plan view illustrating a schematic configuration of the periphery removing apparatus 61. FIG. 9 is a side view illustrating the schematic configuration of the periphery removing apparatus 61.

The periphery removing apparatus 61 is equipped with a chuck 180 configured to hold the combined wafer T on a top surface thereof. The chuck 180 is configured to attract and hold the support wafer S in the state that the processing target wafer W is placed at an upper side and the support wafer S is placed at a lower side. Further, the chuck 180 is configured to be rotated around a vertical axis by a rotating mechanism 181.

Provided above the chuck 180 is a pad 190 configured to transfer the processing target wafer W while holding the peripheral portion We thereof. The pad 190 is connected with a suction mechanism (not shown) such as, but not limited to, a vacuum pump, and the pad 190 is configured to attract and hold the peripheral portion We on a bottom surface thereof. The pad 190 is equipped with an elevating mechanism 191 configured to move the pad 190 in a vertical direction and a moving mechanism 192 configured to move the pad 190 in horizontal directions (the X-axis direction and the Y-axis direction).

A detector 200 is provided above the chuck 180 to detect whether the peripheral portion We is removed from the processing target wafer W. The detector 200 detects presence or absence of the peripheral portion We in the processing target wafer W which is held by the chuck 180 and from which the peripheral portion We is removed. By way of example, a sensor may be used as the detector 200. The sensor may be, by way of non-limiting example, a line type laser displacement meter, and it detects the presence or absence of the peripheral portion We by radiating laser to the peripheral portion of the combined wafer T (processing target wafer W) and measuring a thickness of the combined wafer T. However, the way how to detect the presence or absence of the peripheral portion We by the detector 200 is not limited thereto. For example, the detector 200 may detect the presence or absence of the peripheral portion We by imaging the combined wafer T (processing target wafer W) with, for example, a line camera.

Further, a collector (not shown) configured to collect the peripheral portion We transferred by the pad 190 is provided under the chuck 180. The collector receives and collects the peripheral portion We attracted to and held by the pad 190.

Figure 10:
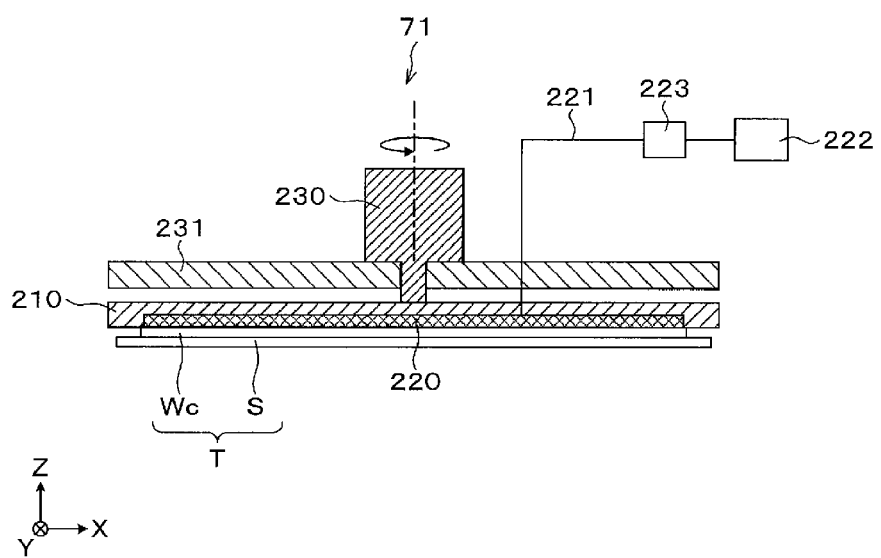
FIG. 10 is a longitudinal cross sectional view illustrating a schematic configuration of a transfer arm.

Now, the transfer arm 71 of the aforementioned wafer transfer device 70 will be described. FIG. 10 is a longitudinal cross sectional view illustrating a schematic configuration of the transfer arm 71.

The transfer arm 71 is equipped with a circular attraction plate 210 having a diameter larger than a diameter of the combined wafer T. A holder 220 configured to hold the central portion Wc of the processing target wafer W is provided in a bottom surface of the attraction plate 210.

A suction line 221 for suctioning the central portion Wc is connected to the holder 220, and the suction line 221 is connected to a suction mechanism 222 such as, but not limited to, a vacuum pump. The suction line 221 is provided with a pressure sensor 223 configured to measure a suction pressure. Though a configuration of the pressure sensor 223 is not particularly limited, a diaphragm pressure sensor may be used.

A rotating mechanism 230 configured to rotate the attraction plate 210 around a vertical axis is provided on a top surface of the attraction plate 210. The rotating mechanism 230 is supported at a supporting member 231. Further, the supporting member 231 (rotating mechanism 230) is supported at the arm member 72.

Figure 11:
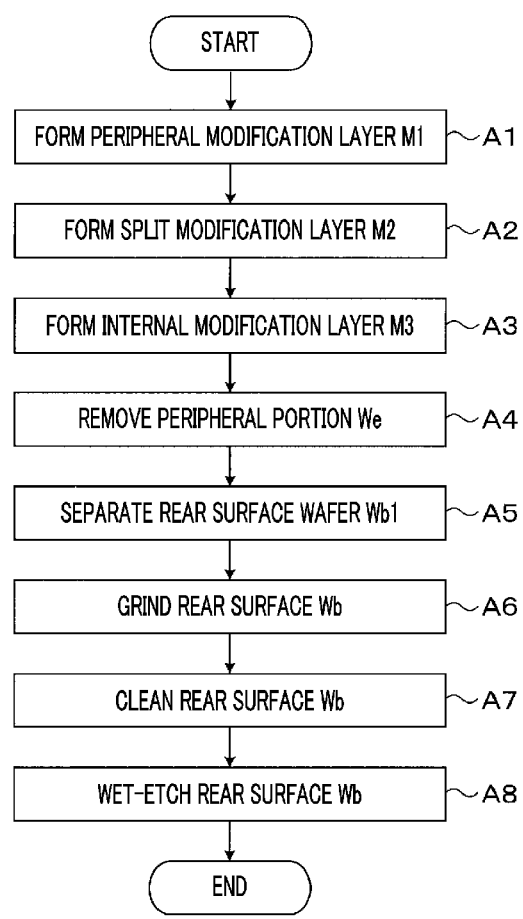
FIG. 11 is a flowchart illustrating main processes of a wafer processing.

Now, a wafer processing performed by using the wafer processing system 1 configured as described above will be discussed. FIG. 11 is a flowchart illustrating main processes of the wafer processing. FIG. 12A to FIG. 12F are explanatory diagrams illustrating the main processes of the wafer processing. In the present exemplary embodiment, the combined wafer T is previously formed by bonding the processing target wafer W and the support wafer S in the bonding apparatus (not shown) at the outside of the wafer processing system 1.

Figure 12A:
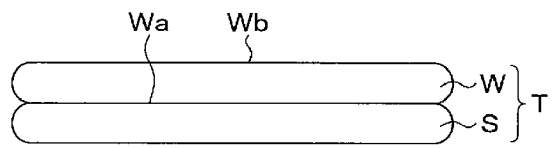
FIG. 12A to FIG. 12F are explanatory diagrams illustrating the main processes of the wafer processing.

First, the cassette Ct accommodating therein the multiple number of combined wafers T shown in FIG. 12A is placed on the cassette placing table 10 of the carry-in/out station 2.

Figure 12B:
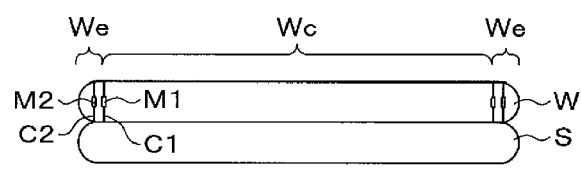
Figure 12C:
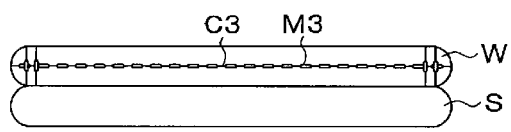

Then, the combined wafer T is taken out of the cassette Ct by the wafer transfer device 20, and transferred into the transition device 30. Subsequently, the combined wafer T is taken out of the transition device 30 by the wafer transfer device 50, and transferred into the modifying apparatus 60. In the modifying apparatus 60, a peripheral modification layer M1 and a split modification layer M2 are formed inside the processing target wafer W in sequence as illustrated in FIG. 12B (processes A1 and A2 of FIG. 11), and, also, an internal modification layer M3 is formed as illustrated in FIG. 12C (process A3 of FIG. 11). The peripheral modification layer M1 serves as a starting point when the peripheral portion We is removed in the edge trimming. The split modification layer M2 serves as starting point when the peripheral portion We to be removed is broken into smaller pieces. The internal modification layer M3 serves as a starting point for thinning the processing target wafer W.

FIG. 13A to FIG. 13E are explanatory diagrams illustrating main processes of a modifying processing performed by the modifying apparatus 60. First, as shown in FIG. 13A, the chuck 100 (slider table 102) is moved to a carry-in/out position P1. Then, the combined wafer T is carried in from the wafer transfer device 50 to be held by the chuck 100.

Then, the chuck 100 is moved to a macro-alignment position P2, as shown in FIG. 13B. The macro-alignment position P2 is a position where the macro-camera 150 is capable of imaging the outer end portion of the processing target wafer W.

Thereafter, the outer end portion of the processing target wafer W is imaged by the macro-camera 150 in 360 degrees in a circumferential direction of the processing target wafer W. The obtained image is outputted to the control device 90 from the macro-camera 150.

In the control device 90, the first eccentric amount between the center Cc of the chuck 100 and the center Cw of the processing target wafer W is calculated from the image obtained by the macro-camera 150. Further, in the control device 90, a moving amount of the chuck 100 is calculated based on the first eccentric amount to correct a Y-axis component of the first eccentric amount. The chuck 100 is moved in the Y-axis direction based on the calculated moving amount, and then moved to a micro-alignment position P3, as shown in FIG. 13C. The micro-alignment position P3 is a position where the micro-camera 160 is capable of imaging the peripheral portion of the processing target wafer W. Here, the field of view of the micro-camera 160 is smaller (about ⅕) than the field of view of the macro-camera 150, as stated above. Thus, if the Y-axis component of the first eccentric amount is not corrected, the peripheral portion of the processing target wafer W may not be included in an angle of view of the micro-camera 160, resulting in a failure to image the peripheral portion of the processing target wafer W with the micro-camera 160. For the reason, the correction of the Y-axis component based on the first eccentric amount is performed to move the chuck 100 to the micro-alignment position P3.

Subsequently, the boundary between the bonding region Aa and the non-bonding region Ab is imaged by the micro-camera 160 in 360 degrees in the circumferential direction of the processing target wafer W. The obtained image is outputted to the control device 90 from the micro-camera 160.

In the control device 90, the second eccentric amount between the center Cc of the chuck 100 and the center Ca of the bonding region Aa is calculated from the image obtained by the micro-camera 160. Further, in the control device 90, the position of the chuck 100 with respect to the peripheral modification layer M1 is decided based on the second eccentric amount such that the center of the chuck 100 and the center of the bonding region Aa are coincident with each other. As stated above, though the non-bonding region Ab is formed before the processing target wafer W and the support wafer S are bonded, a center of this non-bonding region Ab (center Ca of the bonding region Aa) may be deviated from the center of the processing target wafer W. However, as in the present exemplary embodiment, by adjusting the position of the chuck 100 with respect to the peripheral modification layer M1 based on the second eccentric amount, the deviation of the non-bonding region Ab can be corrected.

Subsequently, the chuck 100 is moved to a modifying position P4, as shown in FIG. 13D. The modifying position P4 is a position where the laser head 110 radiates the laser light to the processing target wafer W to thereby form the peripheral modification layer M1. Further, in the present exemplary embodiment, the modifying position P4 is identical to the micro-alignment position P3.

Figure 14:
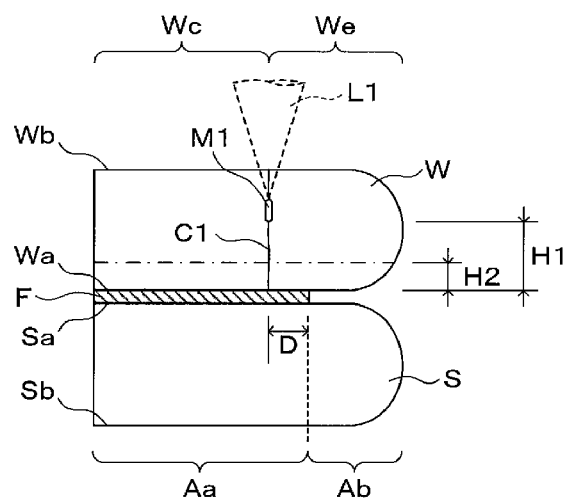
FIG. 14 is an explanatory diagram showing a state in which a peripheral modification layer is being formed in a processing target wafer.
Figure 15:
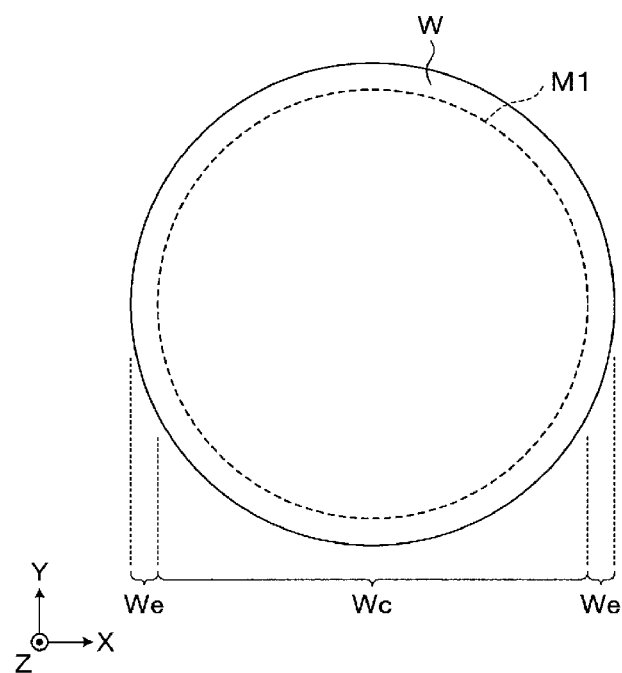
FIG. 15 is an explanatory diagram showing a state in which the peripheral modification layer is formed in the processing target wafer.

Thereafter, as illustrated in FIG. 14 and FIG. 15, by radiating laser light L1 (laser light L1 for periphery) from the laser head 110, the peripheral modification layer M1 is formed at the boundary between the peripheral portion We and the central portion Wc of the processing target wafer W (process A1 of FIG. 11). The shape and the number of the laser light L1 are adjusted by the LCOS 112. To elaborate, to form the peripheral modification layer M1 to be described later, the shape of the laser light L1 is adjusted as the focal point and the phase thereof are controlled. In the present exemplary embodiment, the number of the laser light L1 is one.

The peripheral modification layer M1 formed by the laser light L1 is elongated in a thickness direction and has an aspect ratio with a vertically longer side. A lower end of the peripheral modification layer M1 is located above a target surface (indicated by a dashed line in FIG. 14) of the processing target wafer W after being thinned. That is, a distance H1 between the lower end of the peripheral modification layer M1 and the front surface Wa of the processing target wafer W is larger than a target thickness H2 of the processing target wafer W after being thinned. In this case, the peripheral modification layer M1 does not remain in the processing target wafer W after being thinned. Further, within the processing target wafer W, a crack C1 develops from the peripheral modification layer M1, and reaches the front surface Wa and the rear surface Wb.

Further, the peripheral modification layer M1 is formed at an inner side than an outer end portion of the bonding region Aa in the diametrical direction. Even if the peripheral modification layer M1 is formed while being deviated from the outer end portion of the bonding region Aa due to, for example, a processing error or the like when the peripheral modification layer M1 is formed by the laser light L1 from the laser head 110, the peripheral modification layer M1 can be suppressed from being formed at an outer side than the outer end portion of the bonding region Aa in the diametrical direction. Here, if the peripheral modification layer M1 is formed at the outer side than the outer end portion of the bonding region Aa in the diametrical direction, the processing target wafer W may not be firmly bonded to the support wafer S after the peripheral portion We is removed. In the present exemplary embodiment, however, this state of the processing target wafer W can be securely suppressed.

Further, the present inventors have conducted researches and found out that the peripheral portion We can be appropriately removed if a distance D between the peripheral modification layer M1 and the outer end portion of the bonding region Aa is sufficiently small. This distance D is desirably within 500 μm and, more desirably, within 50 μm.

Here, in the control device 90, the position of the chuck 100 is decided based on the second eccentric amount. In the process A1, to locate the chuck 100 at the decided position, the chuck 100 is rotated by the rotator 103 and moved in the Y-axis direction by the horizontally moving member 104 such that the center of the chuck 100 and the center of the bonding region Aa are coincident. At this time, the rotating of the chuck 100 and the moving of the chuck 100 in the Y-axis direction are synchronized. By performing the completely synchronized control as stated above, the chuck 100 can be moved to the decided position appropriately with little error.

While rotating and moving the chuck 100 (processing target wafer W) as described above, the laser light L1 is radiated to the inside of the processing target wafer W from the laser head 110. That is, while correcting the second eccentric amount, the peripheral modification layer M1 is formed. The peripheral modification layer M1 is formed in a ring shape to be concentric with the bonding region Aa. That is, the distance D between the peripheral modification layer M1 and the outer end portion of the bonding region Aa shown in FIG. 14 can be made constant. Thus, in the periphery removing apparatus 61, the peripheral portion We can be appropriately removed, starting from the peripheral modification layer M1.

Further, in the present exemplary embodiment, if the second eccentric amount includes an X-axis component, this X-axis component is corrected by rotating the chuck 100 while moving it in the Y-axis direction. Meanwhile, if the second eccentric amount does not include the X-axis component, the chuck 100 only needs to be moved in the Y-axis direction without being rotated.

Figure 16:
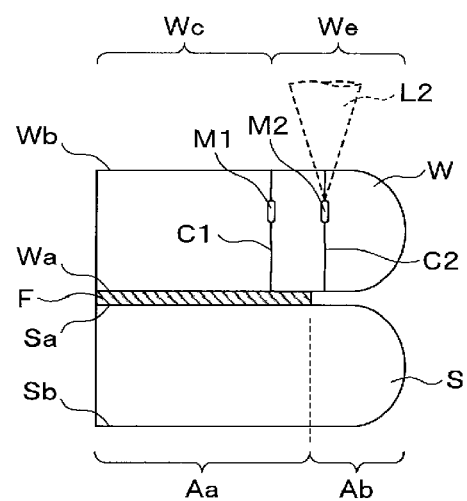
FIG. 16 is an explanatory diagram showing a state in which a split modification layer is being formed in the processing target wafer.
Figure 17:
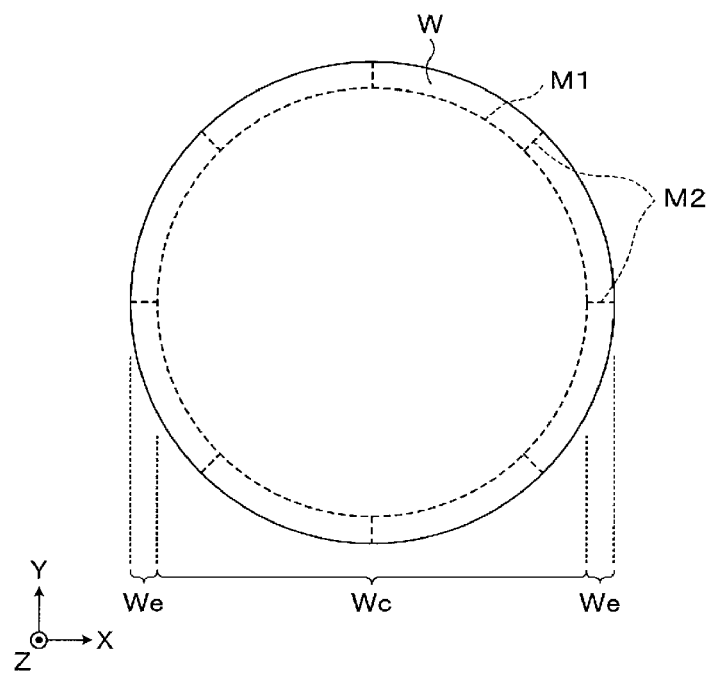
FIG. 17 is an explanatory diagram showing a state in which the split modification layer is formed in the processing target wafer.

Thereafter, the laser head 110 is moved in the Y-axis direction, and by radiating laser light L2 (laser light L2 for split) from the laser head 110, the split modification layer M2 is formed at an outer side than the peripheral modification layer M1 in the diametrical direction (process A2 of FIG. 11), as illustrated in FIG. 16 and FIG. 17. At this time, the laser light radiated from the laser head 110 is switched to the laser light L2 from the laser light L1 by the LCOS 112, and the shape and the number of the laser light L2 are adjusted. To be specific, as a focal position and a phase of the laser light L2 are adjusted, the shape of the laser light L2 is adjusted to form the split modification layer M2 to be described later. Further, in the present exemplary embodiment, the number of the laser light L2 is one.

The split modification layer M2 is elongated in the thickness direction and has an aspect ratio with a vertically longer side, the same as the peripheral modification layer M1. Further, in the present exemplary embodiment, the split modification layer M2 is formed on a level with the peripheral modification layer M1. In addition, a crack C2 develops from the split modification layer M2 and reaches the front surface Wa and the rear surface Wb.

Furthermore, by forming multiple split modification layers M2 and cracks C2 at a pitch of several micrometers (μm) in the diametrical direction, a single line-shaped split modification layer M2 elongated outwards from the peripheral modification layer M1 in the diametrical direction is formed, as shown in FIG. 17. Further, in the shown example, the line-shaped split modification layer M2 elongated in the diametrical direction is formed at eight different positions. However, the number of the split modification layers M2 is not particularly limited. As long as the split modification layers M2 are formed at two different positions at least, the peripheral portion We can be removed. In this case, when removing the peripheral portion We in the edge trimming, this peripheral portion We is separated starting from the ring-shaped peripheral modification layer M1 to be split into multiple pieces by the split modification layers M2. Accordingly, the peripheral portion We to be removed is broken into smaller pieces, and thus can be removed more easily.

Moreover, though the laser head 110 is moved in the Y-axis direction to form the split modification layer M2 in the present exemplary embodiment, the chuck 100 may be moved in the Y-axis direction instead.

Figure 18:
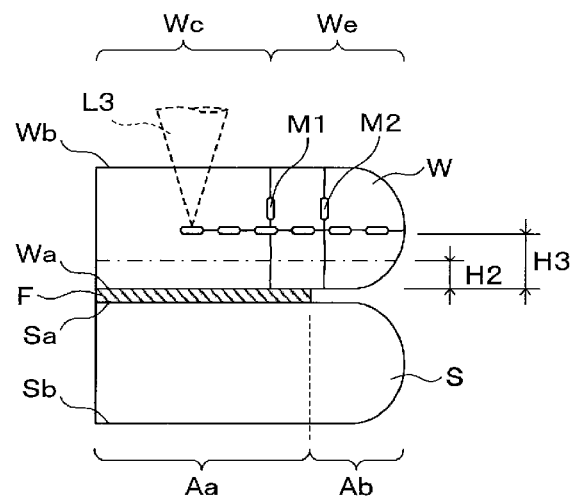
FIG. 18 is an explanatory diagram showing a state in which an internal modification layer is being formed in the processing target wafer.
Figure 19:
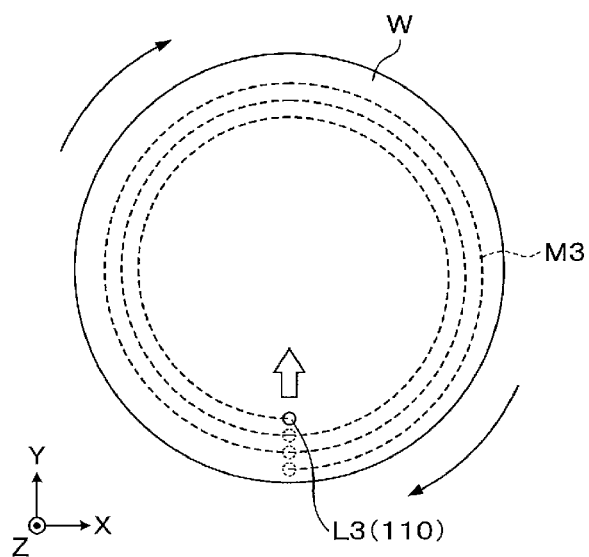
FIG. 19 is an explanatory diagram showing a state in which the internal modification layer is formed in the processing target wafer.

Subsequently, as depicted in FIG. 18 and FIG. 19, by radiating laser light L3 (laser light L3 for internal surface) from the laser head 110, the internal modification layer M3 is formed along a plane direction of the processing target wafer W (process A3 of FIG. 11). At this time, the laser light radiated from the laser head 110 is switched to the laser light L3 from the laser light L2 by the LCOS 112, and the shape and the number of the laser light L3 are adjusted. To be specific, as a focal position and a phase of the laser light L3 are adjusted, the shape of the laser light L3 is adjusted to form the internal modification layer M3 to be described later. Further, in the present exemplary embodiment, the number of the laser light L3 is one. In addition, black arrows shown in FIG. 19 indicate a rotation direction of the chuck 100, the same as in the following description.

A lower end of the internal modification layer M3 is located above the target surface (indicated by a dashed line in FIG. 18) of the processing target wafer W after being thinned. That is, a distance H3 between the lower end of the internal modification layer M3 and the front surface Wa of the processing target wafer W is slightly larger than the target thickness H2 of the processing target wafer W after being thinned. Within the processing target wafer W, a crack C3 develops from the internal modification layer M3 along the plane direction.

In the process A3, while rotating the chuck 100 (processing target wafer W) and moving the laser head 110 in the Y-axis direction from the peripheral portion of the processing target wafer W toward the central portion thereof, the laser light L3 is radiated from the laser head 110 to the inside of the processing target wafer W. As a result, the internal modification layer M3 is formed in a spiral shape from an outer side to an inner side within the surface of the processing target wafer W.

Further, in the present exemplary embodiment, though the laser head 110 is moved in the Y-axis direction to form the internal modification layer M3, the chuck 100 may be moved in the Y-axis direction instead.

Subsequently, the chuck 100 is moved to the carry-in/out position P1, as shown in FIG. 13E. Then, the combined wafer T is taken out by the wafer transfer device 70.

Figure 12D:
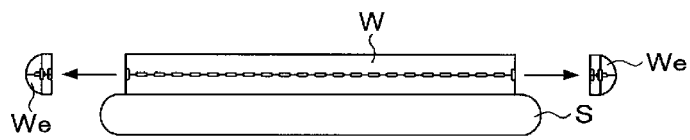
Figure 20:
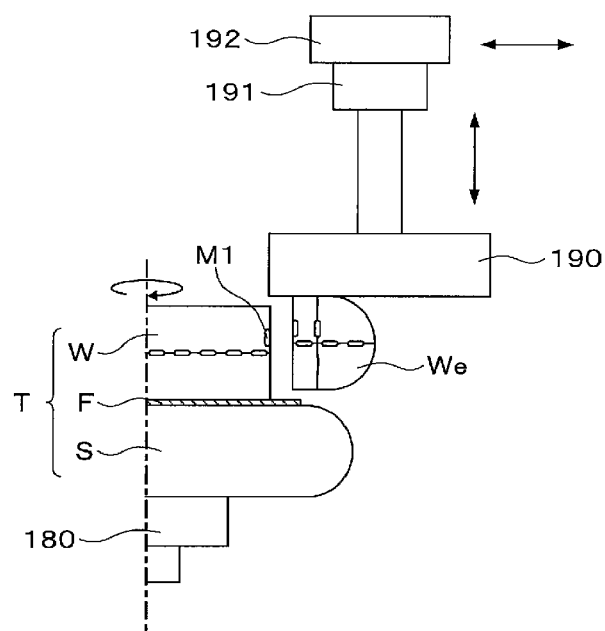
FIG. 20 is an explanatory diagram showing a state in which a peripheral portion is being removed.

Then, the combined wafer T is transferred into the periphery removing apparatus 61 by the wafer transfer device 70. In the periphery removing apparatus 61, the peripheral portion We of the processing target wafer W is removed starting from the peripheral modification layer M1 (process A4 of FIG. 11), as illustrated in FIG. 12D. In the process A4, as illustrated in FIG. 20, the pad 190 is lowered by the elevating mechanism 191 to attract and hold the peripheral portion We, and, then, the pad 190 is raised. As a result, the peripheral portion We held by the pad 190 is separated from the processing target wafer W, starting from the peripheral modification layer M1. At this time, the peripheral portion We is separated while being broken into smaller pieces starting from the split modification layers M2. Further, the removed peripheral portion We is collected from the pad 190 into the collector (not shown).

Figure 12E:
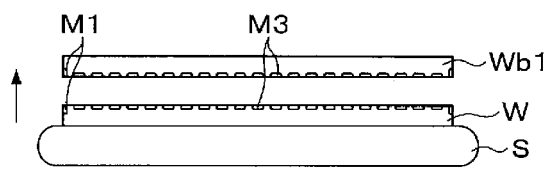

Thereafter, the combined wafer T is transferred into the processing apparatus 80 by the wafer transfer device 70. First, in the processing apparatus 80, when the combined wafer T is delivered from the transfer ram 71 onto the chuck 81, the rear surface Wb side of the processing target wafer W (hereinafter, referred to as "rear surface wafer Wb1") is separated starting from the internal modification layer M3 (process A5 of FIG. 11), as illustrated in FIG. 12E.

Figure 21A:
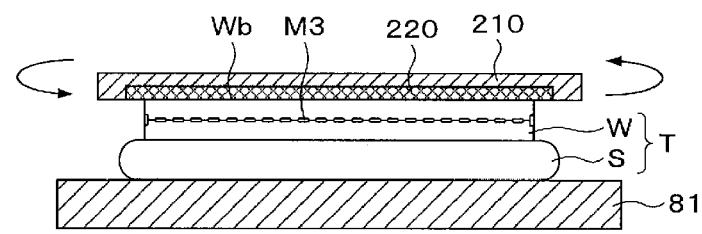
FIG. 21A and FIG. 21B are explanatory diagrams showing a state in which a rear surface wafer is being separated from the processing target wafer.
Figure 21B:
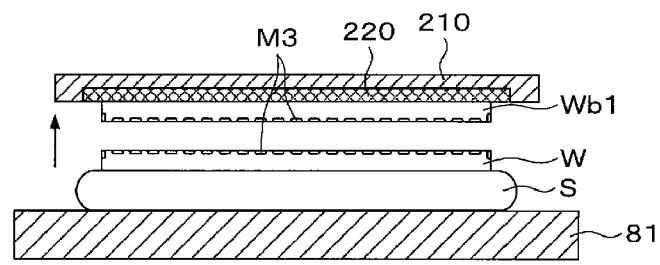

In the process A5, the support wafer S is attracted to and held by the chuck 81 while the processing target wafer W is attracted to and held by the attraction plate 210 of the transfer arm 71, as shown in FIG. 21A. Then, the attraction plate 210 is rotated, and the rear surface wafer Wb1 is cut along the internal modification layer M3. Thereafter, as shown in FIG. 21B, the attraction plate 210 is raised in the state that the rear surface wafer Wb1 is attracted to and held by the attraction plate 210, so that the rear surface wafer Wb1 is separated from the processing target wafer W. At this time, by measuring a pressure for suctioning the rear surface wafer Wb1 with the pressure sensor 223, presence or absence of the rear surface wafer Wb1 is detected. Thus, it can be checked whether the rear surface wafer Wb1 is separated from the processing target wafer W. Further, if the rear surface wafer Wb1 can be separated only by raising the attraction plate 210 as shown in FIG. 21B, the rotating of the attraction plate 210 shown in FIG. 21A can be omitted. Further, the separated rear surface wafer Wb1 is collected to the outside of the wafer processing system 1.

Figure 12F:
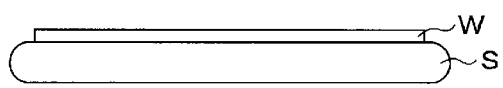

Subsequently, as shown in FIG. 12F, the rear surface Wb of the processing target wafer W held by the chuck 81 is ground, and the internal modification layer M3 and the peripheral modification layer M1 left on the rear surface Wb are removed (process A6 of FIG. 11). In the process A6, by rotating the processing target wafer W and the grinding whetstone in the state that the rear surface Wb is in contact with the grinding whetstone, the rear surface Wb is ground. Further, the rear surface Wb of the processing target wafer W may be then cleaned by a cleaning liquid from a cleaning liquid nozzle (not shown).

Thereafter, the combined wafer T is transferred to the cleaning apparatus 41 by the wafer transfer device 70. In the cleaning apparatus 41, the ground rear surface Wb of the processing target wafer W is scrub-cleaned (process A7 of FIG. 11). Further, in the cleaning apparatus 41, the rear surface Sb of the support wafer S as well as the rear surface Wb of the processing target wafer W may be cleaned.

Afterwards, the combined wafer T is transferred to the etching apparatus 40 by the wafer transfer device 50. In the etching apparatus 40, the rear surface Wb of the processing target wafer W is wet-etched by the chemical liquid (process A8 of FIG. 11). A grinding mark may be formed on the rear surface Wb ground by the aforementioned processing apparatus 80. In the process A8, the grinding mark can be removed by performing the wet-etching, so that the rear surface Wb can be flattened.

Then, the combined wafer T after being subjected to all the required processings is transferred to the transition device 30 by the wafer transfer device 50, and then transferred into the cassette Ct on the cassette placing table 10 by the wafer transfer device 20. Accordingly, a series of the processes of the wafer processing in the wafer processing system 1 is ended.

In addition, according to the present exemplary embodiment, the peripheral modification layer M1, the split modification layer M2 and the internal modification layer M3 can be formed by adjusting the shapes of the laser lights L1 to L3 by using the single laser head 110. That is, even when directions in which the modification layers are elongated are different or even when required processing qualities are different, the appropriate shape of the laser light can be selected by using the single laser head 110. Since a modification layer having any required shape can be formed, the degree of freedom in forming the modification layer can be improved. Further, since a footprint of the apparatus can be reduced, space can be saved. Furthermore, since the apparatus configuration is simplified, an apparatus cost can be cut. As stated above, in the present exemplary embodiment, the pre-treatment of the thinning and the edge trimming of the processing target wafer W can be performed efficiently.

Further, according to the present exemplary embodiment, the edge trimming is carried out by removing the peripheral portion We starting from the peripheral modification layer M1, and the thinning of the processing target wafer W is carried out by separating the rear surface wafer Wb1 starting from the internal modification layer M3. Since the laser head 110 used to form the peripheral modification layer M1 and the internal modification layer M3 is not easily degraded with a lapse of time, less consumables are used. Therefore, a frequency of maintenance can be reduced. Furthermore, since these processings are dry-processes using the laser, disposing of grinding water and waste water is not required. Therefore, a running cost can be reduced. Hence, as compared to conventional edge trimming and thinning by grinding, a running cost can be reduced. That is, in the present exemplary embodiment, the edge trimming and the thinning with the reduced running cost can be accomplished by using the single laser head 110.

Furthermore, in the present exemplary embodiment, although the rear surface Wb is ground in the process A6, this grinding needs to be performed just to remove the internal modification layer M3 and the peripheral modification layer M1, and the grinding amount thereof is small (about several tens of micrometers). In contrast, in case of grinding the rear surface Wb to thin the processing target wafer W as in the prior art, the grinding amount thereof is large (e.g., 700 μm), and the grinding whetstone is abraded greatly. Thus, in the present exemplary embodiment, the frequency of the maintenance can be further reduced.

Furthermore, in the above-described exemplary embodiments, though the laser lights L1 to L3 having the different shapes are radiated by the single laser head 110, it is desirable that the laser head 110 is corrected (calibrated) before the combined wafer T as a processing target is carried into the modifying apparatus 60. To be more specific, it is desirable to correct the laser head 110 before the combined wafer T is held on the chuck 100. In this case, since the correction upon the laser head 110 need not be performed during the modifying processing upon the single processing target wafer W, a time required for the switching of the laser lights L1 to L3 can be saved. As a result, a throughput of the wafer processing can be improved.

Figure 22A:
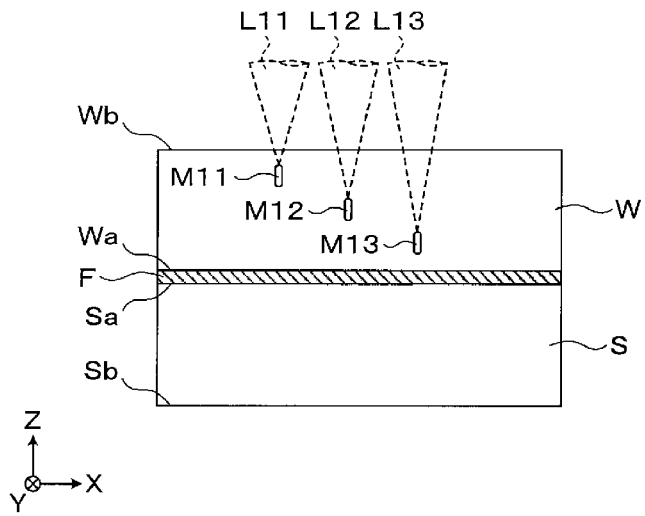
FIG. 22A to FIG. 22C are explanatory diagrams showing a state in which a peripheral modification layer is being formed in a processing target wafer in another exemplary embodiment.
Figure 22B:
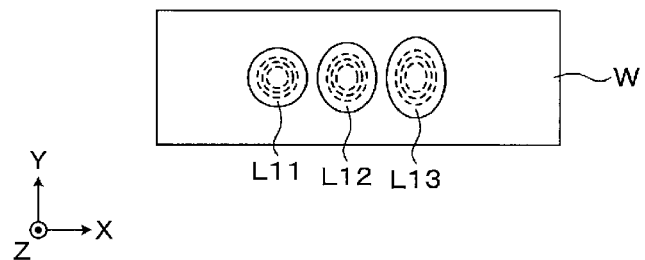
Figure 22C:
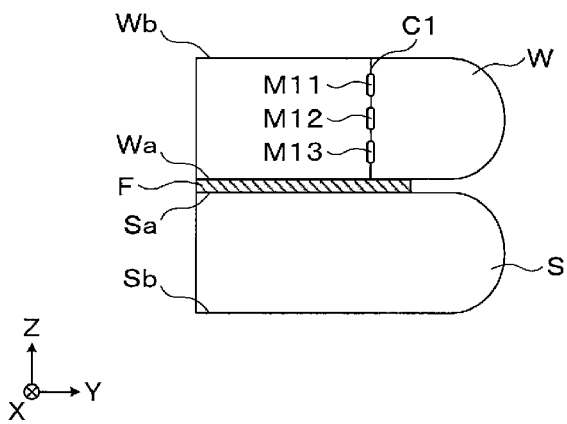
Figure 23:
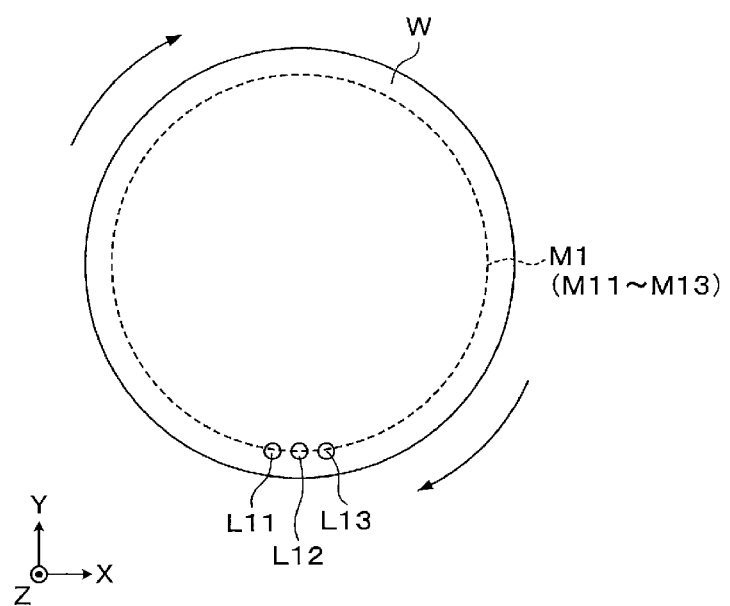
FIG. 23 is an explanatory diagram showing a state in which a peripheral modification layer is being formed in a processing target wafer in another exemplary embodiment.

In the above-described exemplary embodiments, although the single laser light L1 is radiated to the inside of the processing target wafer W from the laser head 110 to form the peripheral modification layer M1, multiple laser lights L1 may be radiated. As stated above, the laser head 110 has the LCOS 112 and is capable of adjusting the shape and the number of the laser light L1. The present exemplary embodiment will be described for a case where a plurality of, for example, three laser lights L11 to L13 are radiated, as illustrated in FIG. 22A to FIG. 23. However, the number of the laser lights L1 is not limited to the example of the present exemplary embodiment.

The laser lights L11 to L13 are arranged in the X-axis direction. The X-axis direction is a tangent direction of a rotational direction of the processing target wafer W and is a proceeding direction in which the peripheral modification layer M1 is formed. Further, focal positions of the laser lights L11 to L13 are different in a thickness direction of the processing target wafer W. For example, the focal positions of the laser lights L11 to L13 become lower in the order of L11, L12 and L13. By radiating the laser lights L11 to L13 from the laser head 110 at the same time while rotating the processing target wafer W, peripheral modification layers M11 to M13 are formed at different positions in the thickness direction.

In this case, by forming the plurality of peripheral modification layers M11 to M13 at the same time, development of the crack C1 can be accelerated, and, as a result, a time required to form the peripheral modification layer M1 can be shortened. Therefore, the throughput of the wafer processing can be further improved.

Figure 24A:
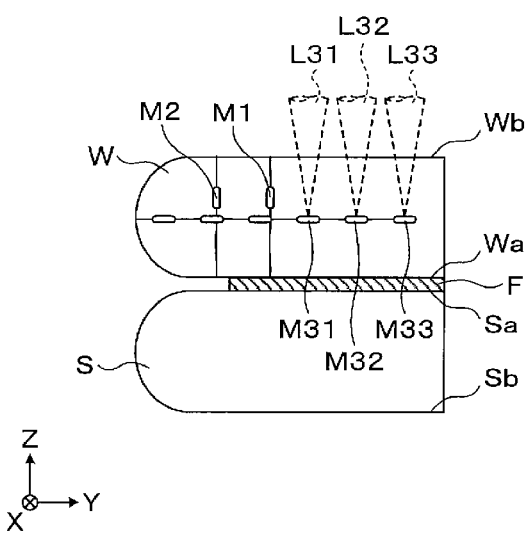
FIG. 24A and FIG. 24B are explanatory diagrams showing a state in which an internal modification layer is being formed in a processing target wafer in another exemplary embodiment.
Figure 24B:
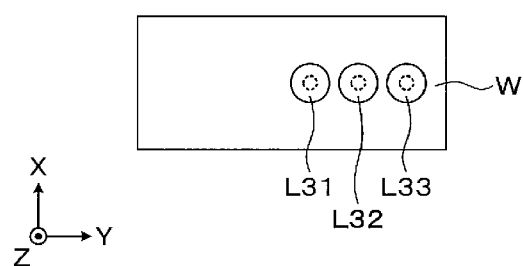
Figure 25:
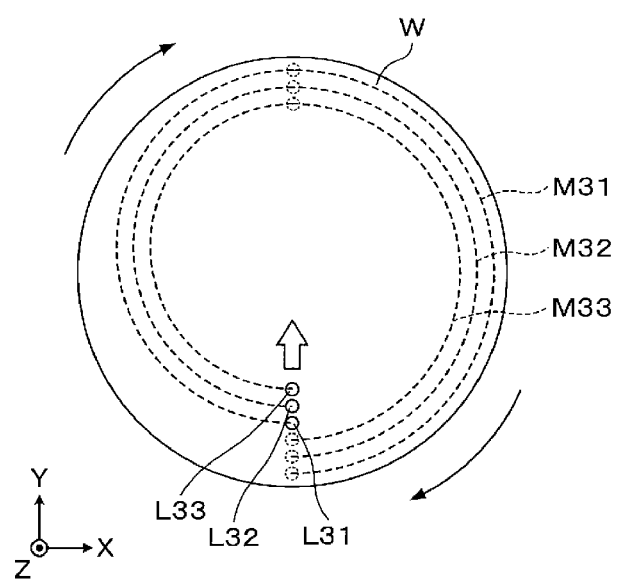
FIG. 25 is an explanatory diagram showing a state in which an internal modification layer is being formed in a processing target wafer in another exemplary embodiment.

Moreover, in the above-described exemplary embodiments, although one laser light L3 is radiated to the inside of the processing target wafer W from the laser head 110 to form the internal modification layer M3, multiple laser lights L3 may be radiated. The present exemplary embodiment will be described for a case where a plurality of, for example, three laser lights L31 to L33 are radiated, as illustrated in FIG. 24A to FIG. 25. Here, however, the number of the laser lights L3 is not limited to the example of the present exemplary embodiment.

The laser lights L31 to L33 are arranged in the Y-axis direction. The Y-axis direction is a proceeding direction in which the internal modification layer M3 is formed. Further, focal positions of the laser lights L31 to L33 are different in a plane direction of the processing target wafer W. By radiating the laser lights L31 to L33 from the laser head 110 at the same time while rotating the processing target wafer W, internal modification layers M31 to M33 are formed.

In this case, by forming the plurality of internal modification layers M31 to M33 at the same time, a time required to form the internal modification layer M3 in the entire surface of the processing target wafer W can be shortened. Therefore, the throughput of the wafer processing can be further improved.

Figure 26:
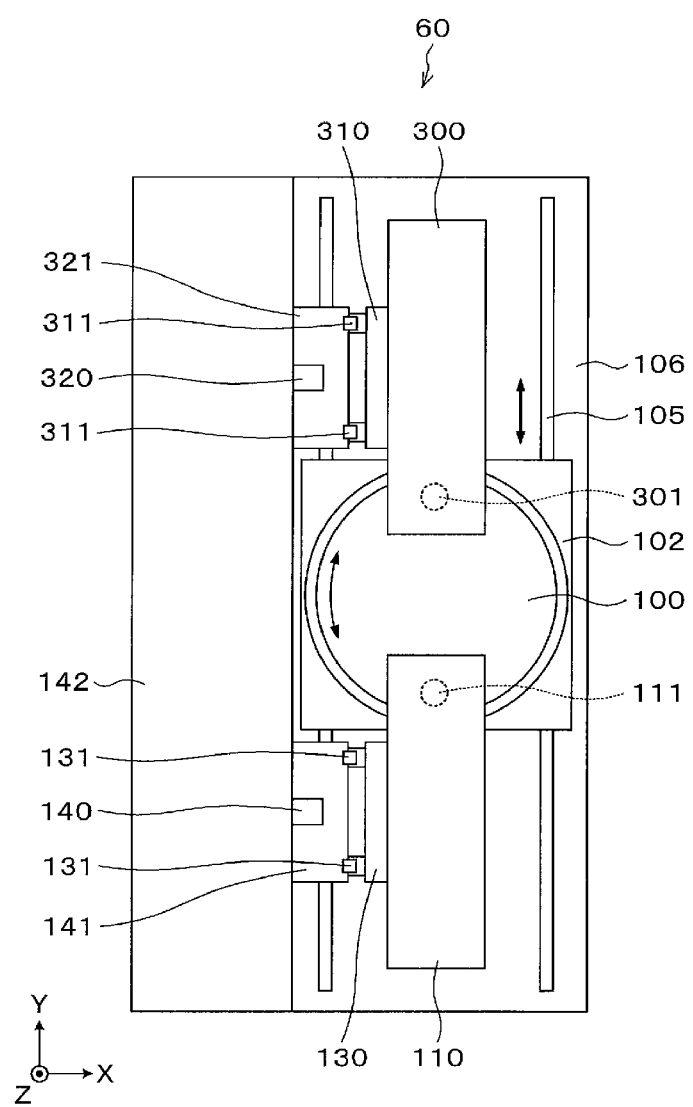
FIG. 26 is a plan view illustrating a schematic configuration of a modifying apparatus according to another exemplary embodiment.

Although the modifying apparatus 60 according to the above-described exemplary embodiments is equipped with the single laser head 110, a plurality of, for example, two laser heads 110 and 300 may be provided, as illustrated in FIG. 26. In the present exemplary embodiment, for the convenience of explanation, the laser head 110 is referred to as a first laser head 110, and the laser head 300 is referred to as a second laser head 300. The number of the laser heads is not limited to the example of the present exemplary embodiment. Further, in FIG. 26, illustration of the macro-camera 150 and the micro-camera 160 is omitted for the simplicity of illustration.

The second laser head 300 is provided at a positive Y-axis side of the first laser head 110. The second laser head 300 has the same configuration as that of the first laser head 110. That is, the second laser head 300 has a lens 301 and a LCOS 302. Further, the laser light output unit 120 may be shared by the first laser head 110 and the second laser head 300. That is, the laser light output unit 120 may be used to output the laser light L to the second laser head 300. Alternatively, a separate laser light output unit may be used for the second laser head 300.

A supporting configuration of the second laser head 300 is the same as the supporting configuration of the first laser head 110. That is, the second laser head 300 is supported at a supporting member 310, a rail 311, an elevating mechanism 320 and a moving mechanism 321. The second laser head 300 is configured to be movable up and down and, also, movable in the Y-axis direction.

Figure 27:
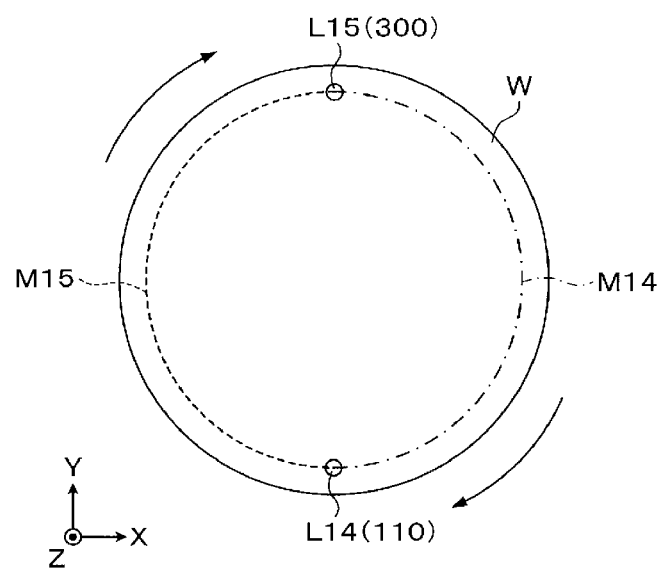
FIG. 27 is an explanatory diagram showing a state in which a peripheral modification layer is being formed in a processing target wafer in the another exemplary embodiment.

In this configuration, when forming the peripheral modification layer M1, the first laser head 110 and the second laser head 300 are arranged on the same circle at the peripheral portion of the processing target wafer W, as illustrated in FIG. 27. Then, while rotating the processing target wafer W, laser light L14 is radiated from the first laser head 110, and laser light L15 is radiated from the second laser head 300. As a result, a peripheral modification layer M14 is formed by the laser light L14, and a peripheral modification layer M15 is formed by the laser light L15. Each of the peripheral modification layers M14 and M15 is formed in a half round on the processing target wafer W, and these peripheral modification layers M14 and M15 form the peripheral modification layer M1 of a ring shape together. That is, in the present exemplary embodiment, the processing target wafer W only needs to be rotated by 180 degrees when forming the peripheral modification layer M1. In this case, the time taken to form the peripheral modification layer M1 can be shortened, so that the throughput of the wafer processing can be further improved.

Further, in the above-described exemplary embodiment, the laser light L14 from the first laser head 110 and the laser light L15 from the second laser head 300 are radiated to the same depth within the processing target wafer W, so the peripheral modification layer M14 and the peripheral modification layer M15 are formed at the same depth. However, by radiating the laser light L14 and the laser light L15 to different depths, the peripheral modification layer M14 and the peripheral modification layer M15 may be formed at the different depths.

Figure 28:
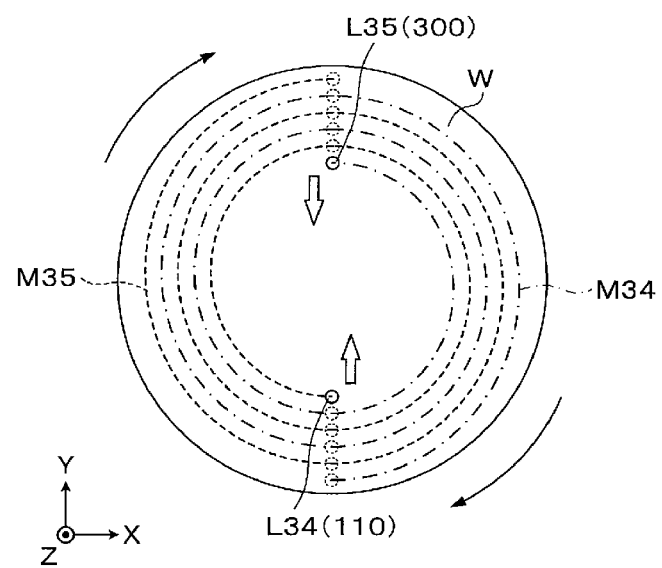
FIG. 28 is an explanatory diagram showing a state in which an internal modification layer is being formed in a processing target wafer in the another exemplary embodiment.

Moreover, when forming the internal modification layer M3, the first laser head 110 and the second laser head 300 are arranged on the same circle at the peripheral portion of the processing target wafer W, as shown in FIG. 28. Then, while rotating the processing target wafer W, the first laser head 110 and the second laser head 300 are respectively moved in the Y-axis directions from the peripheral portion of the processing target wafer W toward the central portion thereof. That is, the first laser head 110 is moved in the positive Y-axis direction, whereas the second laser head 300 is moved in the negative Y-axis direction. During the rotating of the processing target wafer W and the moving of the laser heads 110 and 300, laser light L34 is radiated to the inside of the processing target wafer W from the first laser head 110, and laser light L35 is radiated to the inside of the processing target wafer W from the second laser head 300. As a result, an internal modification layer M34 is formed by the laser light L34, and an internal modification layer M35 is formed by the laser light L35. Each of the internal modification layers M34 and M35 is formed in a spiral shape, so that the internal modification layer M3 is formed within the entire surface of the processing target wafer W. Since the internal modification layers M34 and M35 are formed at the same time as stated above, the time taken to form the internal modification layer M3 can be shortened, so that the throughput of the wafer processing can be further improved.

In the above-described exemplary embodiments, the split modification layer M2 is formed by using the laser head 110 which is used to form the peripheral modification layer M1 and the internal modification layer M3. However, another laser head (not shown) may be used.

In the above-described exemplary embodiments, the peripheral portion We is removed in the state that this peripheral portion We is held by the pad 190 in the periphery removing apparatus 61. However, the way how to remove the peripheral portion We may not be limited thereto. By way of example, the peripheral portion We may be removed by applying a physical impact, an ultrasonic wave, or the like to the peripheral portion We.

Additionally, in the above-described exemplary embodiments, although the separation of the rear surface wafer Wb1 from the processing target wafer W is performed when the combined wafer T is delivered to the chuck 81 of the processing apparatus 80 from the transfer arm 71 of the wafer transfer device 70, the way how to separate the rear surface wafer Wb1 is not limited thereto. By way of example, a separating device (not shown) may be provided in the same apparatus where the periphery removing apparatus 61 is provided, or this separating device (not shown) may be provided separately.

Further, in the above-described exemplary embodiments, after the peripheral portion We of the processing target wafer W is removed, the processing target wafer W is thinned by separating the rear surface wafer Wb1 of the processing target wafer W starting from the internal modification layer M3. However, the removing of the peripheral portion We and the thinning of the processing target wafer W may be performed at the same time.

Figure 29A:
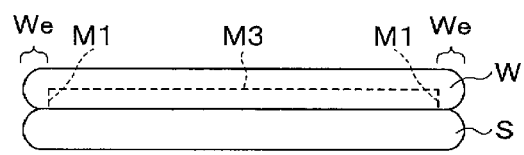
FIG. 29A and FIG. 29B are explanatory diagrams illustrating main processes of a wafer processing according to another exemplary embodiment.

For example, as depicted in FIG. 29A, the annular peripheral modification layer M1 is formed within the processing target wafer W, and, also, the internal modification layer M3 is formed along the plane direction of the processing target wafer W. At this time, an upper end of the peripheral modification layer M1 is set to be substantially on a level with a height at which the internal modification layer M3 is formed. Further, as for the order of forming the peripheral modification layer M1 and the internal modification layer M3, the peripheral modification layer M1 may be formed first, or vice versa.

Figure 29B:
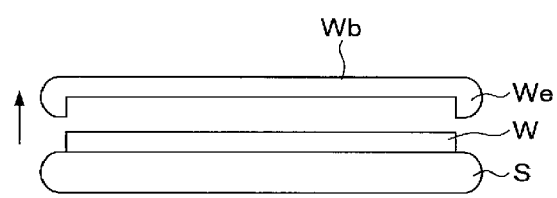

Thereafter, as shown in FIG. 29B, the rear surface Wb side of the processing target wafer W is separated starting from the peripheral modification layer M1 and the internal modification layer M3. In this way, by separating the rear surface Wb side starting from the internal modification layer M3, the processing target wafer W can be thinned. At this time, the peripheral portion We is removed as one body with the wafer at the rear surface Wb side.

In this case, since the removing of the peripheral portion We and the thinning of the processing target wafer W are performed at the same time, the throughput of the wafer processing can be further improved.

It should be noted that the exemplary embodiment is illustrative in all aspects and is not anyway limiting. The above-described exemplary embodiment may be omitted, replaced and modified in various ways without departing from the scope and the spirit of claims.

By way of example, in the above-described exemplary embodiments, the non-bonding region Ab is formed at an interface between the processing target wafer W and the support wafer S before being bonded. However, the non-bonding region Ab may be formed after they are bonded. By way of example, by radiating laser light to a peripheral portion of the oxide film F after the processing target wafer W and the support wafer S are bonded, a bonding strength therebetween can be reduced, so that the non-bonding region Ab can be formed.

According to the exemplary emdodiments, it is possible to efficiently perform, in the combined substrate in which the substrates are bonded to each other, the pre-treatments for removing of the peripheral portion of the single substrate and thinning of this single substrate.

We claim:

1. A substrate processing apparatus configured to process a substrate, comprising:
   a holder having a substrate holding surface and connected to a rotator that rotates the substrate holding surface, wherein the substrate holding surface holds, in a combined substrate in which a first substrate and a second substrate are bonded to each other, the second substrate;

a laser configured to radiate laser light for internal surface to the first substrate;

a control device and a storage including a computer program, wherein the storage and the computer program are configured, with the control device, to control the rotator and the laser to form, to an inside of the first substrate held by the substrate holding surface, a peripheral modification layer by radiating laser light for periphery by the laser along a boundary between a peripheral portion of the first substrate as a removing target and a central portion thereof, and, also, to form an internal modification layer by radiating laser light for internal surface by the laser along a plane direction of the first substrate while rotating the substrate holding surface by the rotator, wherein the laser switches the laser light for periphery and the laser light for internal surface by adjusting at least a shape or a number of the laser light for periphery and the laser light for internal surface.

2. The substrate processing apparatus of claim 1, wherein the laser includes a LCOS.

3. The substrate processing apparatus of claim 1, wherein the laser is calibrated before the combined substrate is held on the substrate holding surface.

4. The substrate processing apparatus of claim 1, wherein the laser light for periphery includes multiple laser lights for periphery, and the laser radiates the multiple laser lights for periphery to the inside of the first substrate at a same time, and focal positions of the multiple laser lights for periphery are different in a thickness direction of the first substrate.

5. The substrate processing apparatus of claim 1, wherein the laser light for internal surface includes multiple laser lights for internal surface, and the laser radiates the multiple laser lights for internal surface to the inside of the first substrate at a same time, and focal positions of the multiple laser lights for internal surface are different in the plane direction of the first substrate.

6. The substrate processing apparatus of claim 1, wherein the laser forms a split modification layer by radiating laser light for split to the inside of the first substrate held by the substrate holding surface from the peripheral modification layer toward an outer side in a diametrical direction, and the laser adjusts at least a shape or a number of the laser light for split.

7. The substrate processing apparatus of claim 1, wherein the laser includes multiple lasers.

8. The substrate processing apparatus of claim 1, wherein the laser is configured to be moved up and down in a vertical direction and, also, moved in a horizontal direction.

9. The substrate processing apparatus of claim 1, wherein the laser light for periphery includes multiple laser lights for periphery, and the laser radiates the multiple laser lights for periphery to the inside of the first substrate at a same time, and the multiple laser lights for periphery are arranged in a proceeding direction in which the peripheral modification layer is formed, and focal positions of the multiple laser lights for periphery are different in a thickness direction of the first substrate.

10. The substrate processing apparatus of claim 1, wherein the laser light for periphery includes multiple laser lights for periphery, and the laser radiates the multiple laser lights for periphery to the inside of the first substrate at a same time while rotating the substrate holding surface by the rotator, wherein the multiple laser lights for periphery are arranged in a proceeding direction in which the peripheral modification layer is formed, and focal positions of the multiple laser lights for periphery are different in a thickness direction of the first substrate, and wherein an upper end of the peripheral modification layer is set to be substantially on a level with a height at which the internal modification layer is formed.

11. A substrate processing method of processing a substrate, comprising:

holding, in a combined substrate in which a first substrate and a second substrate are bonded to each other, the second substrate with a holder having a substrate holding surface for holding the second substrate and connected to a rotator that rotates the substrate holding surface;

forming a peripheral modification layer by radiating laser light for periphery from a laser to an inside of the first substrate held by the substrate holding surface along a boundary between a peripheral portion of the first substrate as a removing target and a central portion thereof; and forming an internal modification layer by radiating laser light for internal surface from the laser to the inside of the first substrate held by the substrate holding surface along a plane direction of the first substrate while rotating the substrate holding surface by the rotor, wherein the laser switches the laser light for periphery and the laser light for internal surface by adjusting at least a shape or a number of the laser light for periphery and the laser light for internal surface.

12. The substrate processing method of claim 11, wherein the laser switches the laser light for periphery and the laser light for internal surface by a LCOS belonging to the laser.

13. The substrate processing method of claim 11, wherein the laser is calibrated before the combined substrate is held on the substrate holding surface.

14. The substrate processing method of claim 11, wherein the laser light for periphery includes multiple laser lights for periphery, and the laser radiates the multiple laser lights for periphery to the inside of the first substrate at a same time in the forming of the peripheral modification layer, and focal positions of the multiple laser lights for periphery are different in a thickness direction of the first substrate.

15. The substrate processing method of claim 11, wherein the laser light for internal surface includes multiple laser lights for internal surface, and the laser radiates the multiple laser lights for internal surface to the inside of the first substrate at a same time in the forming of the internal modification layer, and focal positions of the multiple laser lights for internal surface are different in the plane direction of the first substrate.

16. The substrate processing method of claim 11, further comprising:

forming a split modification layer by radiating laser light for split from the laser to the inside of the first substrate held by the substrate holding surface from the peripheral modification layer toward an outer side in a diametrical direction, wherein the laser adjusts at least a shape or a number of the laser light for split.

17. The substrate processing method of claim 11, wherein the laser includes multiple lasers, and
each of the multiple lasers radiates the laser light for periphery to the inside of the first substrate at a same time in the forming of the peripheral modification layer.

18. The substrate processing method of claim 11, wherein the laser includes multiple lasers, and
each of the multiple lasers radiates the laser light for internal surface to the inside of the first substrate at a same time in the forming of the internal modification layer.

19. The substrate processing method of claim 11,
wherein, in forming of the peripheral modification layer, the laser light for periphery includes multiple laser lights for periphery, and th laser radiates the multiple laser lights for periphery to the inside of the first substrate at a same time, and
the multiple laser lights for periphery are arranged in a proceeding direction in which the peripheral modification layer is formed, and focal positions of the multiple laser lights for periphery are different in a thickness direction of the first substrate.

20. The substrate processing method of claim 11,
wherein, in forming of the peripheral modification layer, the laser light for periphery includes multiple laser lights for periphery, and the laser radiates the multiple laser lights for periphery to the inside of the first substrate at a same time while rotating the substrate holding surface by the rotator,
wherein the multiple laser lights for periphery are arranged in a proceeding direction in which the peripheral modification layer is formed, and focal positions of the multiple laser lights for periphery are different in a thickness direction of the first substrate, and
wherein an upper end of the peripheral modification layer is set to be substantially on a level with a height at which the internal modification layer is formed.

* * * * *